United States Patent [19]

Traylor

[11] Patent Number: 5,418,489

[45] Date of Patent: May 23, 1995

[54] METHOD OF RECOVERING A FREQUENCY MODULATED SIGNAL

[75] Inventor: Kevin B. Traylor, North Richland Hills, Tex.

[73] Assignee: Motorola, Inc., Schaumburg, Ill.

[21] Appl. No.: 134,197

[22] Filed: Oct. 8, 1993

[51] Int. Cl.$^6$ ............................................. H03D 3/00
[52] U.S. Cl. .................................. 329/327; 329/306; 329/323; 329/336; 329/315; 455/324; 455/214; 455/337; 455/209; 375/324; 375/334
[58] Field of Search ............... 329/304, 306, 309, 315, 329/318, 320, 323, 324, 327, 343, 336; 455/209, 206, 207, 214, 316, 337, 324; 375/82, 88, 79, 80, 78, 83, 84, 85, 86

[56] References Cited

U.S. PATENT DOCUMENTS

| | | | |
|---|---|---|---|
| 3,990,016 | 11/1976 | Dimon | 329/323 |
| 4,462,107 | 7/1984 | Vance | 375/88 |
| 4,528,513 | 7/1985 | Dieterich | 329/145 |
| 4,651,107 | 3/1987 | Akaiwa | 455/214 X |
| 4,682,117 | 7/1987 | Gibson | 329/302 |
| 4,755,761 | 7/1988 | Ray, Jr. | 375/80 |
| 4,833,416 | 5/1989 | Attwood | 375/83 X |
| 4,910,800 | 3/1990 | Chung | 455/316 |
| 4,944,025 | 7/1990 | Gehring et al. | 455/207 |
| 4,995,052 | 2/1991 | Thorvaldsen | 329/300 X |
| 5,081,650 | 1/1992 | Hasegawa et al. | 375/80 |
| 5,309,113 | 5/1994 | Mimura et al. | 329/302 |

*Primary Examiner*—Robert J. Pascal
*Assistant Examiner*—Arnold Kinkead
*Attorney, Agent, or Firm*—Kevin A. Bufford

[57] ABSTRACT

An apparatus and method is provided of recovering a frequency modulated signal having a first component of the frequency modulated signal at a zero-RF spectral location and a second component of the frequency modulated signal at a zero-RF spectral location in quadrature relationship to the first component. The method includes the steps of: upconverting and summing the first and second components to produce a reference signal (100), time delaying the first and second components, upconverting and summing the delayed, upconverted first and second components to produce a delayed reference signal (101) in quadrature relationship to the reference signal; limiting the reference and delayed signal (102); and exclusive or-ing (103) the limited reference and limited delayed signal.

11 Claims, 2 Drawing Sheets

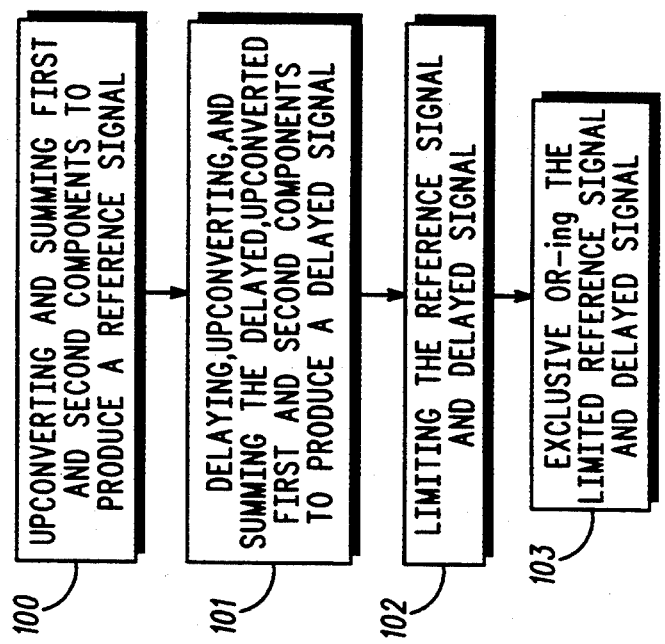
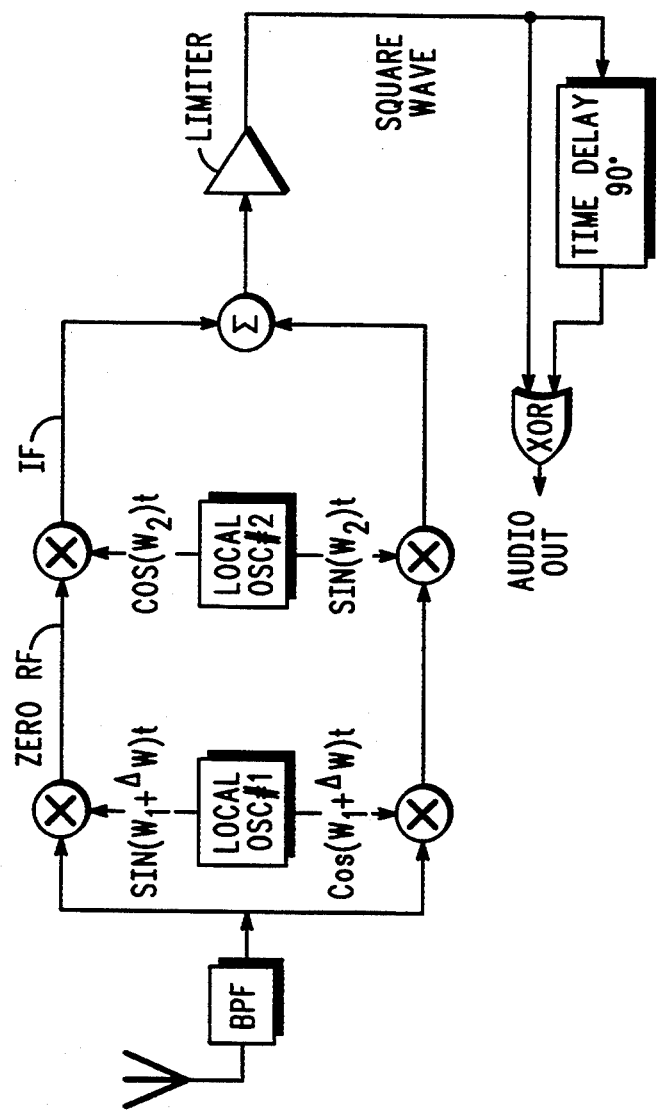

METHOD OF RECOVERING A FREQUENCY MODULATED SIGNAL

FIELD OF THE INVENTION

The invention relates to radio frequency signals and, in particular, to a method of recovering a frequency modulated (FM) signal.

BACKGROUND OF THE INVENTION

Methods of recovery of FM signals using direct conversion receivers are known. Such methods typically involve translation of a signal received on a carrier frequency by a receiver (FIG. 1) from a selected channel to an intermediated frequency (IF), conversion of the IF signal into a square wave and direct conversion to recovered audio by application of the square wave, and a delayed version of the square wave, to a quadrature detector (e.g., an exclusive-or gate).

Such a receiver (FIG. 1) could be used within a cellular communication system operating within the 800–900 MHz transmission band decoding signals with channel spacing of 25 kHz. Within such a system a fully modulated FM signal would deviate from a center point of a carrier frequency of the channel by plus or minus 10 kHz. The rate with which the signal deviates between plus to minus 10 kHz (for a fully modulated signal) is representative of (and tracks) the originally encoded audio signal (e.g., for an input audio signal of 2 kHz the FM signal would cycle between plus and minus 10 kHz of the carrier frequency at a rate of 2 kHz).

Frequency translation of the FM signal from the channel frequency to the IF frequency is typically accomplished by first translating the FM signal to a base band frequency (zero-RF) and then upconverting to the IF frequency. Translation from the channel frequency to the zero-RF state is accomplished by mixing the received signal with an output of a first local oscillator (LOCAL OSC #1). Translation of the FM signal to a zero-RF state, on the other hand, carries with the FM signal, amplitude variations associated with the transmission channel. Amplitude variations of the FM signal, as is known to those in the art, are decoded by the detector as additional audio information. The additional audio information represents interference which degrades the quality of the detected signal.

One way to eliminate amplitude variations is to convert the translated FM signal (at an IF frequency) into a square wave by clipping. The square wave and a delayed copy of the square wave are then input to the exclusive-or gate. The output of the exclusive-or gate is a series of pulses, the average of which is representative of a transmitted audio signal.

The received FM signal (at the carrier frequency) is converted into a square wave by first mixing (in a first mixer) the received signal with a first output of a first local oscillator (LOCAL OSC #1) and, then, mixing within a second mixer the received signal with a second output of the first local oscillator in quadrature relationship with the first output. The outputs of the two mixers (FIG. 4) are quadrature components of the FM signal at zero-RF.

The quadrature components of the FM signal at zero-RF, on the other hand, cannot be summed and clipped at base band frequencies (for application to the exclusive-or gate) because harmonics of audio information (e.g., audio information at 2 kHz would have harmonics at 4, 8 or 16 kHz) would still fall within the bandwidth of the received signal. Because of the problem of harmonics, the quadrature components of the FM signal at zero-RF are mixed, in a second set of mixers, with quadrature components of a second local oscillator (LOCAL OSC #2) to the intermediate frequency (e.g., at 131 kHz) and summed before clipping. The output of the clipper is a square wave from which the audio information may be recovered by application to the exclusive-or gate.

The information is recovered from the square wave by applying the square wave, and a delayed version of the square wave to the exclusive-or gate. The time delay is chosen to place the delayed square wave 90 degrees behind the undelayed squarewave at the center frequency of the IF. At the center frequency of the IF, the output pulses of the exclusive-or gate are the same width as the spaces between the pulses. The average output of the exclusive-or gate at the center frequency of the IF is, consequently, one-half the voltage of the output pulse of the exclusive-or gate. Where the IF deviates upwards in frequency with the FM signal (towards 131 kHz plus 10 kHz) the average output of the exclusive-or gate also increases towards the voltage of a full scale pulse. Where the IF deviates downward (131 kHz minus 10 kHz) the average output of the exclusive-or gate declines towards zero. Because of the relationship of the output of the exclusive-or gate to the time delay, the time delay value of the delayed square wave must be carefully chosen (calibrated) to avoid clipping of the output audio signal.

While recovery of FM signals by direct conversion works well, the reliability of such a system depends on the average output of the exclusive-or gate. In order for the output of the detector to faithfully reproduce the input audio signal the average output of the exclusive-or gate must remain centered. Since the detector is an on-off device the average output of the detector is determined by the relationship of the square wave and the delayed square wave. Where the temporal relationship of the delayed square wave changes (because of aging, temperature, etc.) the detector becomes off-centered, resulting in clipping of the output signal.

Delay of the square wave is typically accomplished through use of a bandpass filter operating at a center point of a filtering (attenuation) curve. Operation at the center point provides sufficient phase shift to provide the delay desired at the detector. Where the operating point of the filter shifts from the center point because of IF frequency shifts, or filter component parametric changes, the reliable operation of the detector is adversely effected. Because of the importance of FM conversion through direct detection techniques, a need exists for a more reliable method of delaying the square wave signal in advance of detection.

BRIEF DESCRIPTION OF THE DRAWINGS

FIG. 1 is a block diagram of a FM receiver in accordance with the prior art.

FIG. 2 is a flow chart of detecting a FM signal in accordance with an embodiment of the invention.

DETAILED DESCRIPTION OF THE PREFERRED EMBODIMENT

The solution to the problem of reliably delaying a FM signal in advance of detection lies, conceptually, in eliminating the square wave signal delay in the IF section and providing a more reliable signal delay device in the zero-RF section ahead of the upconverter. Moving the delay device to the zero-RF section allows for the use of narrow band, low-pass filters as delay devices.

FIG. 2 is a flow chart of FM signal delay and detection in accordance with the invention. Reference will be made to FIG. 2 as appropriate to understanding the invention.

Figure 4:
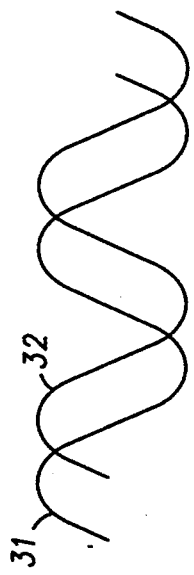
FIG. 4 is a graph of quadrature components of an FM signal at zero RF.
Figure 3:
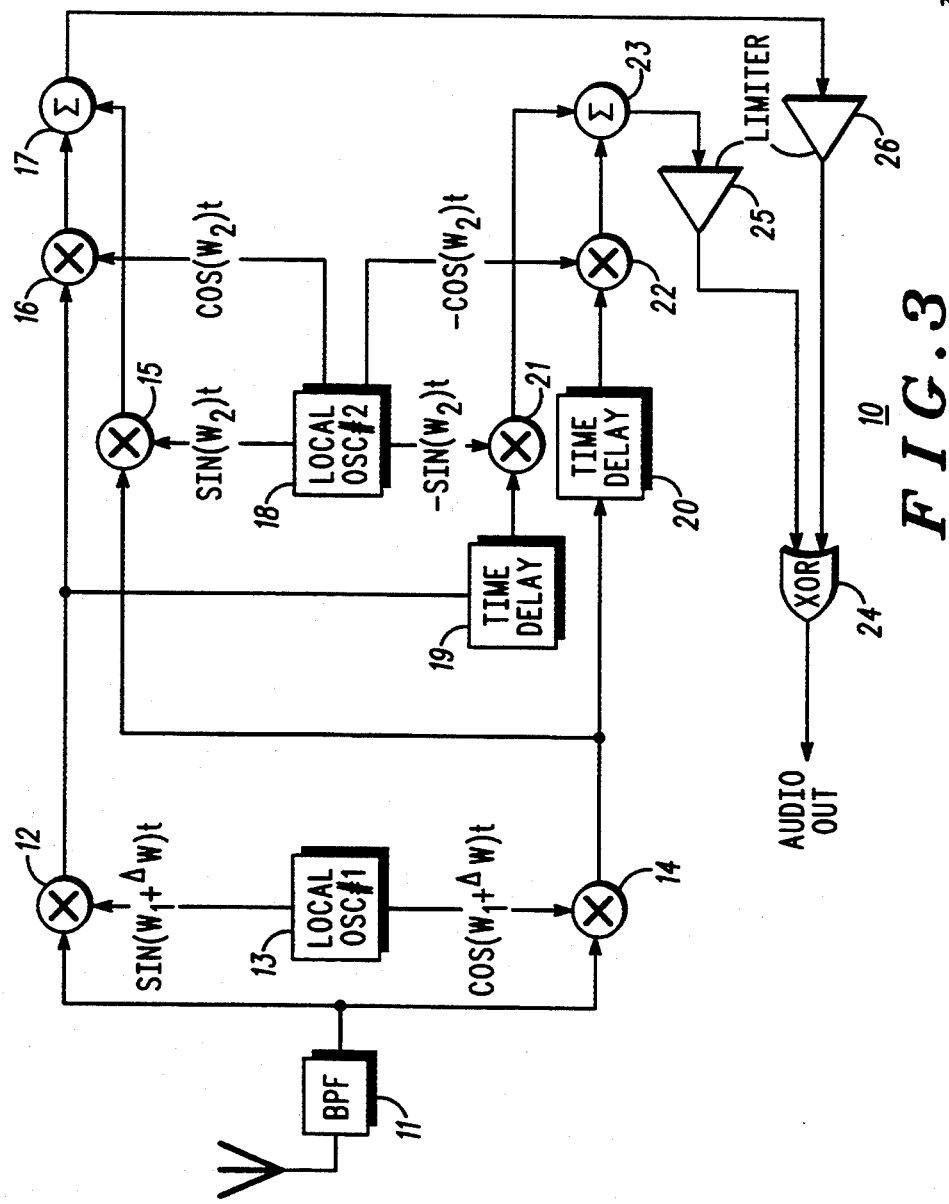
FIG. 3 is a block diagram of a FM receiver in accordance with an embodiment of the invention.

FIG. 3 is a block diagram of a FM receiver, generally designated 10, in accordance with an embodiment of the invention. Included within receiver 10 is a bandpass filter 11 and first local oscillator 13 for translating a received signal to a baseband, all in accordance with the prior art. The bandpass filter 11 provides a method of isolating a desired signal on a selected channel from other signals on other channels within a designated subspectrum. The first local oscillator 13 provides a means of frequency translating the received signal from the selected channel to a zero-RF state at the outputs of mixers 12 and 14. Mixing the received signal with quadrature outputs of the first local oscillator 13 within mixers 12 and 14 provides a means of generating quadrature (first and second) components of the FM signal at zero-RF (illustrated as signals 31 and 32 of FIG. 4).

Within the receiver 10 the first and second components of the FM signal are processed along a first and second signal path to produce a reference signal and a delayed reference signal. The reference signal and the delayed reference signals are then limited and applied to the detector.

Within the receiver 10 (within the first signal path) the reference signal, resembling a square wave, is created at the output of limiter 26 by mixing, in mixers 15, 16, the first and second components of the FM signal with quadrature outputs of the second local oscillator 18, summing the mixed signals, in summer 17, and limiting, in limiter 26. Mixing the first and second components of the FM signal at zero-RF with quadrature outputs (sine $(w_2)t$ and cosine $(w_2)t$) at an intermediate frequency (e.g., 131 kHz) within mixers 15 and 16 acts to upconvert the first and second components of the FM signal to an IF state while maintaining the quadrature relationship of the upconverted first and second signals. Summing the quadrature related signals at the IF state within the summer 17 produces a summed output that resembles a square wave with a double-humped top. Limiting within the limiter 26 completes the process of shaping the square wave.

Within receiver 10 (within the second signal path) a delayed upconverted signal, resembling a square wave, is created at the output of the limiter 25 by delaying the first and second components of the zero-RF FM signal within delay devices 19–20 before upconverting in mixers 21–22, summing in summer 23, and limiting in limiter 25. Since signal delay, in accordance with the invention, occurs at a zero-RF state, simple low-pass filters 19–20 are used for delay devices 19 and 20. To provide sufficient delay, the low-pass filters, 19 and 20, must be wide enough to pass the first and second components of the zero RF FM signal while still providing a linear phase shift over the bandwidth of the first and second components. Following phase shifting of the zero-RF FM signal, upconverting of the delayed signals is accomplished by using quadrature output signals of the second local oscillator 18. (The quadrature output signals used for upconverting in the second signal path are chosen to be 180 degrees out of phase with the quadrature output signals used in the first signal path.)

Following upconversion within the second signal path the upconverted signals are summed within the summer 23. The summed signal is then clipped to shape a square wave within the limiter 25.

Recovery of audio information within the detector 24 of the receiver 10 is accomplished by comparison of the limited reference signal and limited upconverted delayed signal within the detector 24 (exclusive-or gate). The precise relationship of the limited reference signal and limited upconverted delayed signal is insured by the use of quadrature outputs of the local oscillators 13 and 18 and by reliable time delay devices 19–20. Since the time delay devices 19–20 operate at baseband (zero-RF) instead of IF, a large time delay is easily achieved with a simple linear phase lowpass filter. A large time delay is important since the recovered audio level is directly proportional to the time delay. FM receivers constructed in accordance with the invention, in fact, have provided audio output levels three to four times the levels of prior art FM receivers.

The 90 degree phase shift between the limited reference signal and limited upconverted delayed signal is obtained from the quadrature relationship of the upconverter multiplying signals. The quadrature relationship of the limited reference signal and limited upconverted delayed signal (and the baseband first and second components of the FM signal) is maintained by a feedback loop controlling the quadrature outputs of the local oscillators to within less than one degree of error. Switching mixers may be used in the upconverter providing square waves as the multiplying signal. Quadrature square waves are easily generated in the 1 MHz range with D flip flops which have far less than one degree of phase error. Since the 90 degree phase shift is determined by two very accurate sources, the invention does not have the output voltage variation due to variations in the phase shift common to conventional quadrature detectors.

The many features and advantages of this invention are apparent from the detailed specification and thus it is intended by the appended claims to cover all such features and advantages of the system which fall within the true spirit and scope of the invention. Further, since numerous modifications and changes will readily occur to those skilled in the art (e.g., use of digital signal processor delay devices), it is not desired to limit the invention to the exact construction and operation illustrated and described, and accordingly all suitable modifications and equivalents may be resorted to, falling within the scope of the invention.

It is, of course, to be understood that the present invention is, by no means, limited to the specific showing in the drawing, but also comprises any modification within the scope of the appended claims.

I claim:
1. A method of recovering a frequency modulated signal having a first component of the frequency modulated signal at a zero-RF spectral location and a second component of the frequency modulated signal at a zero-RF spectral location in quadrature relationship to the first component, such method comprising the steps of: upconverting and summing the first and second compo- nents to produce a reference signal; time delaying the first and second components, upconverting and summing the delayed, upconverted first and second components to produce a delayed reference signal in quadrature relationship to the reference signal; limiting the reference and delayed reference signals; and detecting the limited reference and limited delayed reference signals.

2. The method as in claim 1 wherein the step of detecting the limited reference and limited delayed reference signals further comprises the step of applying the limited reference and limited delayed reference signals to an exclusive-or gate.

3. The method as in claim 1 further including the step of upconverting using an image balanced mixer.

4. The method as in claim 3 wherein the step of upconverting and summing the first and second components using the image balanced mixer further comprises the steps of multiplying the first component by an upconversion signal so as to form a first product and the second component by a quadrature version of the upconversion signal so as to form a second product and summing the first and second products so as to form the reference signal.

5. The method as in claim 3 wherein the step of upoconverting and summing the delayed first and second components using the image balanced mixer further comprises the steps of multiplying the first delayed component by a further upconversion signal so as to form a first product and multiplying the second delayed component by a quadrature version of the further upconversion signal so as to form a second product and summing the first and second products so as to form the delayed reference signal.

6. A method of recovering a frequency modulated signal in a direct conversion receiver having a first signal of the frequency modulated signal at a zero-RF spectral location and a second signal of the frequency modulated signal at a zero-RF spectral location and in quadrature relationship to the first signal, such method comprising the steps of:
upconverting the first and second signals using an image balanced mixer to produce a reference signal; time delaying the first and second signals and upconverting the delayed first and second signals using a second image balanced mixer to produce a delayed reference signal in quadrature relationship to the reference signal when the frequency modulated signal is not modulated; limiting the reference and delayed reference signals; and exclusive or-ing the limited reference and delayed reference signals.

7. The method as in claim 6 wherein the step of upconverting in an imaged balanced mixer further comprises the steps of multiplying the first signal by an upconversion signal so as to form a first product and the second signal by a quadrature version of the upconversion signal so as to form a second product and summing the first and second products so as to form the reference signal.

8. The method as in claim 7 wherein the step of upconverting using the second image balanced mixer further comprises the steps of multiplying the delayed first signal by an upconversion signal so as to form a first product and multiplying the delayed second signal by a quadrature version of the upconversion signal so as to form a second product and summing the first and second products so as to output the delayed reference signal.

9. An apparatus for recovering a frequency modulated signal in a direct conversion receiver having a first signal of the frequency modulated signal at a zero-RF spectral location and a second signal of the frequency modulated signal at a zero-RF spectral location and in quadrature relationship to the first signal, such apparatus comprising: means for upconverting the first and second signals to produce a reference signal; means for time delaying the first and second signals and upconverting the delayed first and second signals to produce a delayed reference signal in quadrature relationship to the reference signal when the frequency modulated signal is not modulated; means for limiting the reference and delayed reference signals; and means for exclusive or-ing the limited reference and delayed reference signals.

10. The apparatus as in claim 9 wherein the means for upconverting further comprises an image balanced mixer operable for multiplying the first signal by an upconversion signal so as to form a first product and multiplying the second signal by a quadrature version of the upconversion signal so as to form a second product and summing the first and second products.

11. The apparatus as in claim 10 wherein the means for time delaying and upconverting further comprises delay means for receiving and delaying the first and second signals and outputting delayed first and second signals, an image balanced mixer coupled to the delay means adapted for receiving and multiplying the delayed first signal by an upconversion signal so as to form a first product and receiving and multiplying the delayed second signal by a quadrature version of the upconversion signal so as to form a second product, and a summer coupled to the image balanced mixer for receiving and summing the first and second products so as to produce the delayed reference signal.

* * * * *